United States Patent [19]

Sliger

[11] Patent Number: 4,551,772

[45] Date of Patent: Nov. 5, 1985

[54] WRITE DRIVE WITH CURRENT MIRRORS WHICH REDUCE FEED-THROUGH

[75] Inventor: David E. Sliger, Lafayette, Colo.

[73] Assignee: Storage Technology Corporation, Louisville, Colo.

[21] Appl. No.: 594,263

[22] Filed: Mar. 28, 1984

[51] Int. Cl.[4] ............................................... G11B 5/09
[52] U.S. Cl. ................................................... 360/46
[58] Field of Search .................... 360/46, 113, 68; 330/288

[56] References Cited

U.S. PATENT DOCUMENTS

| | | | |
|---|---|---|---|
| 4,015,290 | 3/1977 | Bowers | 360/68 |
| 4,477,846 | 10/1984 | Cortnell et al. | 360/68 |
| 4,489,285 | 12/1984 | Saro | 330/288 |

OTHER PUBLICATIONS

"Predriver for 'H' Configured Write Driver for Magnetic Recording", J. A. Bailey, R. G. Black, Jr. and J. Lewkowicz, IBM Technical Disclosure Bulletin, vol. 23, No. 11, Apr. 1981.

Primary Examiner—Vincent P. Canney
Attorney, Agent, or Firm—Woodcock, Washburn, Kurtz, Mackiewicz & Norris

[57] ABSTRACT

A write driver circuit for a thin film resistive magnetic head has current mirror transistors connected in parallel with the driver transistors which are in an H-configuration. Two resistors connected across the write head have their junction connected to reference potential to create an artificial center tap. In this manner, equal and opposite voltage excursions are produced on both sides of the write head. The transients which would normally be fed through to the read head because of these voltage excursions are cancelled.

4 Claims, 9 Drawing Figures

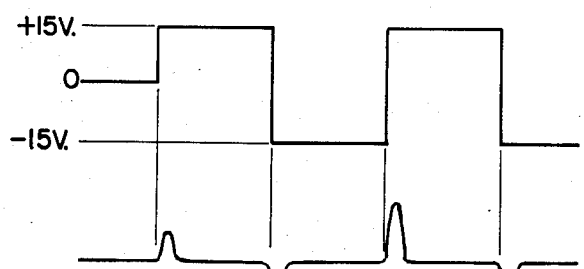
FIG. 2A
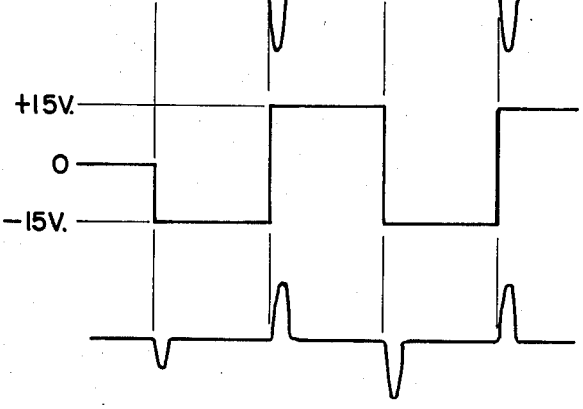
FIG. 2B
FIG. 2C
FIG. 2D
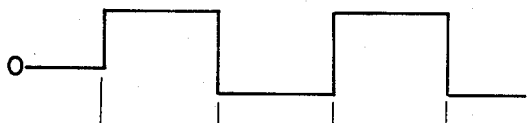
FIG. 3A
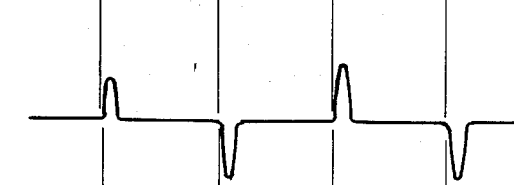
FIG. 3B
FIG. 3C
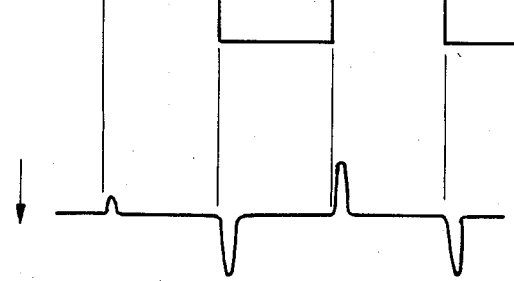
FIG. 3D

WRITE DRIVE WITH CURRENT MIRRORS WHICH REDUCE FEED-THROUGH

BACKGROUND OF THE INVENTION

This invention relates to magnetic recording and more particularly, to a driver circuit for producing bi-directional write current through a magnetic head.

In magnetic recording, the magnetic write head is commonly driven with current in one direction or the other through the head winding to produce bi-directional recording. In magnetic tape systems, it has been common practice to use a write head with a center tap which was connected to reference potential. This produced voltage excursions on both sides of the write head winding which were equal and opposite. The equal and opposite voltage excursions minimized the feed through of transients to the read head circuit. Because the voltage excursions were equal and opposite, the transients which are capacitively coupled to the read circuit are equal and opposite and tend to cancel.

Recently, thin film resistives have been developed for magnetic recording, particularly magnetic tape recording. These heads are produced by a photoresist process. For several reasons, it is not practical to provide a center tap on the head. For one reason, this requires a manual step which is not compatible with the high speed photoresist deposition of the heads.

"PREDRIVER FOR 'H' CONFIGURED WRITE DRIVER FOR MAGNETIC RECORDING", by J. A. Bailey, R. G. Black, Jr., and J. Lewkowicz, IBM TECHNICAL DISCLOSURE BULLETIN, Vol. 23, No. 11, Nov. 1981, shows a write driver for a thin film magnetic write head. The driver transistors are connected in an H-configuration with two driver transistors being turned on to produce current through the head in one direction, and the other being turned on to provide current through the head in the other direction. In such a circuit, the voltage excursions on the two sides of the head are not equal and opposite. Because of this, transients are capacitively coupled to the read circuitry.

It is an object of the present invention to provide a write driver circuit for a thin film magnetic head which has an artificial center tap and which reduces feed through of transients to the read circuit.

SUMMARY OF THE INVENTION

In accordance with the present invention, current mirror transistors are connected in parallel with the driver transistors in a write driver circuit having an H-configuration. Resistors are connected across the magnetic head with a source of reference potential connected at their junction to create an artificial center tap for the head. The voltage excursions across the head are equal and opposite with respect to the reference voltage. The current mirror transistors produce current flow in a path parallel to the head to maintain the current flow through the two driving transistors equal.

The foregoing and other objects, features and advantages of the invention will be better understood from the following more detailed description and appended claims.

SHORT DESCRIPTION OF THE DRAWINGS

FIG. 1. shows the write driver circuit of the present invention;

FIGS. 2A-2D are waveforms depicting the operation of the present invention; and

FIGS. 3A-3D are waveforms depicting the operation of the prior art.

DESCRIPTION OF THE PREFERRED EMBODIMENT

Figure 1:
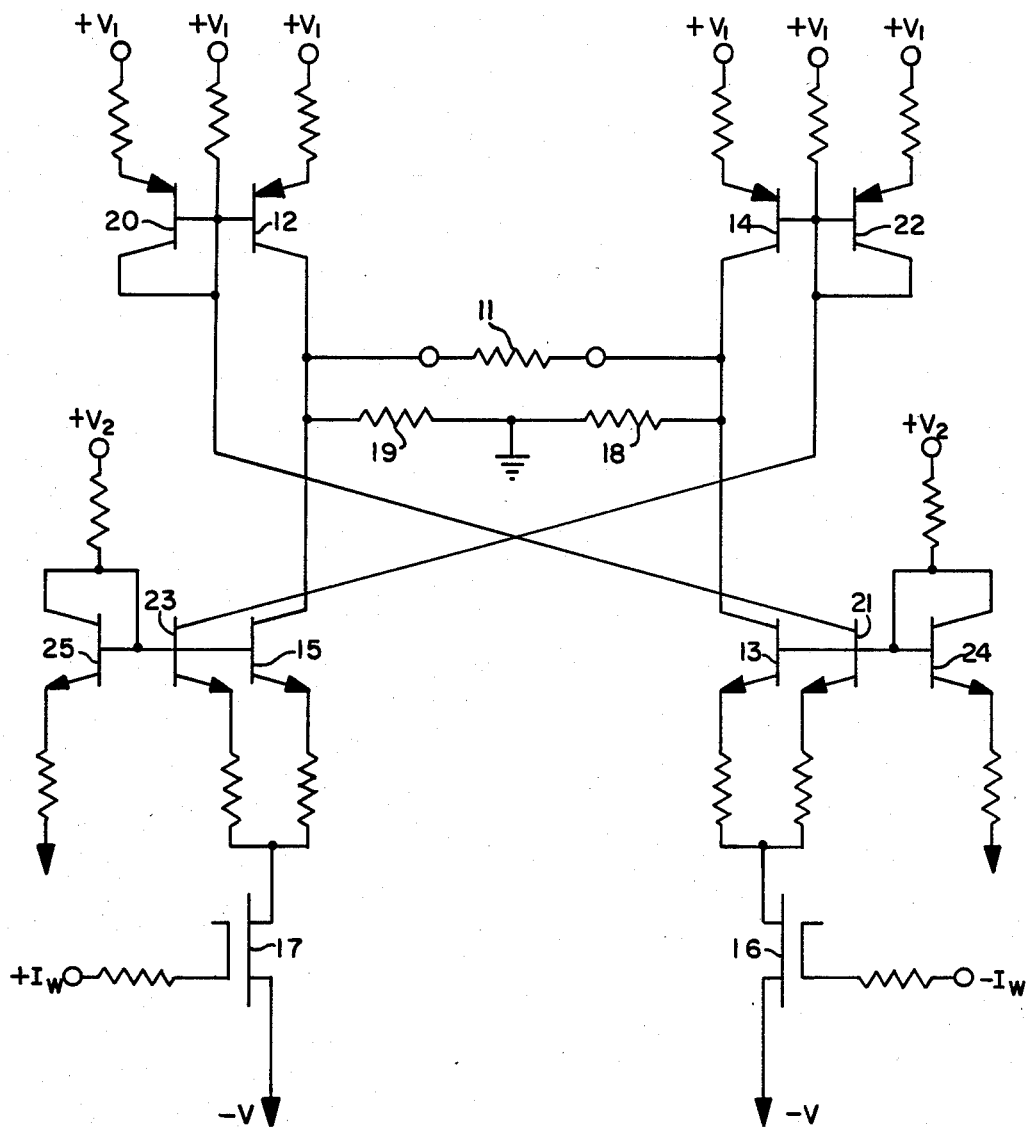

FIG. 1 depicts a thin film magnetic write head 11 which is driven by first and second driving transistors 12 and 13, and third and fourth driving transistors 14 and 15.

In order to produce current flow through the write head 11 in one direction, the VMOS switching transistor 16 is turned on by a switching signal designated IW. When switching transistor 16 is turned on, current flows through the emitter and base of driving transistor 12, through write head 11, and through driving transistor 13, and the switching transistor 16.

In order to produce current flow in the other direction through head 11, VMOS switching transistor 17 is turned on by the switching signal designated $+I_W$. This produces current flow through driver transistor 14, through the write head 11, through the driver transistor 15, and switch 17.

In accordance with the present invention, write head 11 has an artificial center tap created by two resistors 18 and 19, the junction of which is connected to reference potential, in this case, ground. In order to maintain the voltage excursions on both sides of the head 11 equal and opposite, current mirror transistors 20-23 are provided. First and second current mirror transistors 20 and 21 are connected in parallel with first and second driver transistors 12 and 13. Third and fourth current mirror transistors 22 and 23 are connected in parallel with third and fourth driver transistors 14 and 15. The current flow of the current mirror transistors is parallel to, not through, write head 11. The current mirror transistors maintain the voltage excursions across the head equal and opposite. When driver transistors 12 and 13 are conducting, the current flow through transistor 12 is equal to the current flow through transistor 13. Conversely, when driver transistors 14 and 15 are conducting, current mirror transistors 22 and 23 maintain the current flow through driver transistor 14 equal to that through driver transistor 15.

Transistor 24 is biased so that it is normally conducting. It provides base current to the driver transistor 13 and to the current mirror transistor 21. Similarly, transistor 25 is biased so that is is normally conducting. It provides base current to the current mirror transistor 23 and the driver transistor 15.

The operation of the circuit can be better understood with reference to the waveforms of FIGS. 2A-2D. Assume that $+V$ is $+15$ volts and $-V$ is $-15$ volts. FIG. 2A shows the voltage on the left side of head 11 and FIG. 2C shows the voltage on the right side of head 11. FIGS. 2B and 2D show the transients developed by these voltages. Referring to FIG. 2A, when driver transistors 12 and 13 are turned on by switch 16, the voltage at the left-hand side of write head 11 makes an excursion to approximately $+15$ volts.

Referring to FIG. 2C, the voltage of the right-hand side of write head 11 makes an excursion to approximately $-15$ volts. The excursions are equal and opposite. When driver transistors 12 and 13 are turned off, and driver transistors 14 and 15 are turned on, the left side of write head 11 (Fig. 2A) undergoes a negative excursion and the right side of head 11 (FIG. 2C) undergoes an equal and opposite positive excursion.

Capacitive coupling exists between the write head 11 and the read head. This capacitive coupling would normally tend to couple the transients shown in FIG. 2B to the read head as a result of voltage excursions on the left-hand side of the write head 11. Similarly, the transients shown in FIG. 2D would tend to be coupled to the read head as a result of voltage excursions on the right-hand side of write head 11. Note that the transients in FIGS. 2B and 2D and equal and oppoosite. They tend to cancel thereby reducing transient feedthrough.

On the other hand, consider the waveforms of FIG. 3A-3D which similarly depict the operation of an H-driver circuit without the artificial center tap and current mirrors of the present invention. Without the circuit of the present invention, the voltage on both sides of the write head undergoes a voltage excursion in the same direction. That is, when two drivers are turned on to produce the positive excursion on the left side of the head as shown in FIG. 3A, the right hand side of the head (FIG. 3C) also goes positive with the difference between the three excursions producing current flow.

Similarly, when the other pair of driving transistors is turned on, the left side of the head will undergo a negative excursion as shown in FIG. 3A and the right hand side (FIG. 3C) will undergo a negative excursion of larger magnitude. The capacitively coupled transients are shown in FIGS. 3B and 3D. Note that the transients are cumulative, they do not cancel.

In accordance with present invention, a right driver circuit is provided with substantially reduced feed through of transients to the read head.

While a particular embodiment of the invention has been shown and described, various modifications are within the true spirit and scope of the invention. The claims are, therefore, intended to cover all such modifications.

What is claimed is:

1. A write driver circuit for a magnetic head comprising:
    first and second driver transistors connected on both sides of said head to produce current flow through said head in one direction;
    third and fourth driver transistors connected on both sides of said head to produce current flow through said head in the other direction;
    first and second current mirror transistors connected in parallel with said first and second driver transistors to produce current flow in a path parallel to said head to maintain the current flow through said first and second driver transistors equal; and
    third and fourth current mirror transistors connected in parallel with said third and fourth driver transistors to produce current flow in a path parallel to said head to maintain the current flow through said third and fourth driver transistors equal.

2. The write driver circuit recited in claim 1 further comprising:
    two resistors connected across said head with a source of reference potential connected to a junction to create an artificial center tap for said head, the voltage excursions across said head being equal and opposite with respect to said reference voltage.

3. The write driver circuit recited in claim 1 further comprising:
    first and second switching transistors respectively turning on said first and second driver transistors and said third and fourth driver transistors.

4. The write driver circuit recited in claim 1 further comprising:
    a normally conducting transistor supplying base current to said second driver transistor and said second current mirror transistor; and
    a normally conducting transistor supplying base current to said fourth driver transistor and said fourth current mirror transistor.

* * * * *